United States Patent
Yamazaki

(10) Patent No.: US 7,420,216 B2
(45) Date of Patent: Sep. 2, 2008

(54) REFLECTION TYPE LIGHT-EMITTING DIODE DEVICE

(75) Inventor: Shigeru Yamazaki, Kumagaya (JP)

(73) Assignees: Pearl Lamp Works, Ltd., Osaka (JP); Opto-Device Co., Ltd., Saitama (JP)

(*) Notice: Subject to any disclaimer, the term of this patent is extended or adjusted under 35 U.S.C. 154(b) by 335 days.

(21) Appl. No.: 10/553,122

(22) PCT Filed: Apr. 16, 2003

(86) PCT No.: PCT/JP03/04891

§ 371 (c)(1),
(2), (4) Date: Oct. 14, 2005

(87) PCT Pub. No.: WO2004/093204

PCT Pub. Date: Oct. 28, 2004

(65) Prior Publication Data

US 2006/0278881 A1    Dec. 14, 2006

(51) Int. Cl.
*H01L 33/00* (2006.01)
(52) U.S. Cl. ............. 257/81; 257/675; 257/E33.065; 257/E33.066; 257/696; 361/704; 361/712
(58) Field of Classification Search ............ 257/81
See application file for complete search history.

(56) References Cited

U.S. PATENT DOCUMENTS 5,384,471 A * 1/1995 Schairer et al. ............. 257/98

2001/0045573 A1   11/2001   Waitl et al.

FOREIGN PATENT DOCUMENTS

| JP | 63-191647 | 12/1988 |
|----|-----------|---------|
| JP | 06-9158 | 4/1994 |
| JP | 07-211940 | 8/1995 |
| JP | 10-303464 A1 | 11/1998 |
| JP | 11-163411 | 6/1999 |
| JP | 2001-185760 | 7/2001 |
| JP | 2002-033523 | 1/2002 |
| JP | 2002-299693 A1 | 10/2002 |
| WO | WO 2004/093204 A1 | 10/2004 |

* cited by examiner

*Primary Examiner*—Jerome Jackson, Jr.
(74) *Attorney, Agent, or Firm*—Sughrue Mion, PLLC

(57) ABSTRACT

A reflection type light-emitting diode device of a kind capable of emitting rays of light to the outside after having been reflected by a reflecting surface includes a recessed casing (22) having a cavity defining the reflecting surface (15) and also having a pair of bearing grooves (17a and 17b) defined in a peripheral wall thereof, a light-emitting element (11), and first and second lead members each made up of a small width lead segment (12a or 12b) having a relatively small width and a large width lead segment (18a or 18b) having a relatively large width, with the light-emitting element (11) mounted on the small width lead segment (12a) of the first lead members. The first and second lead members are fitted to the recessed casing (22) with the small width lead segments (12a and 12b) thereof received immovably within respective bearing grooves (17a and 17b) in the recessed casing.

2 Claims, 4 Drawing Sheets

Fig. 1
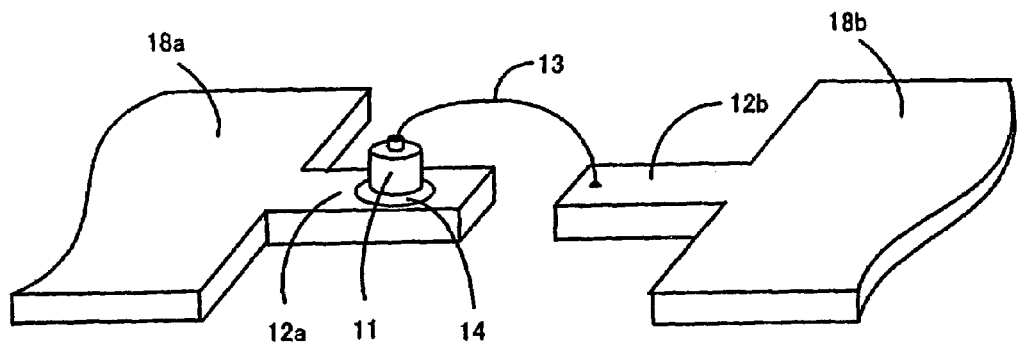
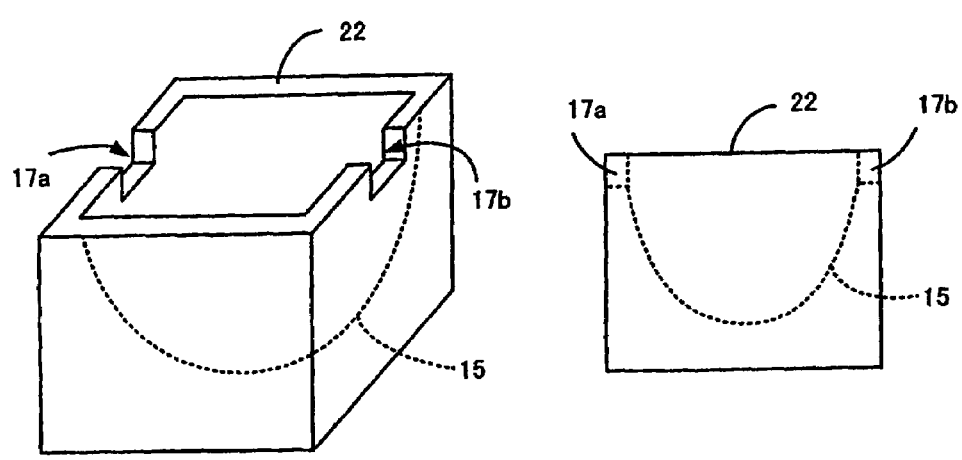
Fig. 2A　　　　Fig. 2B

REFLECTION TYPE LIGHT-EMITTING DIODE DEVICE

FIELD OF THE INVENTION

The present invention generally relates to a reflection type light-emitting diode device surface-mounted on a printed circuit board or the like and, more particularly, to the reflection type light-emitting diode device capable of being surface-mounted on the printed circuit board precisely and capable of improving temperature characteristic while maintaining the radiation efficiency of the light-emitting diode device.

BACKGROUND ART

The surface-mountable light-emitting diode device of a structure shown in FIG. 5 has hitherto been well known in the art. This surface-mountable light-emitting diode device includes a light-emitting element 41 in the form of a light-emitting diode, a resinous substrate 42 and a transparent resin-molded enclosure 43. The resinous substrate 42 is formed by preparing a double-sided printed substrate having conductive foils deposited respectively on opposite front and rear surfaces thereof, depositing circuit patterns 47a and 47b on the front surface by an etching technique, and forming an anode 46b and a cathode 46a on the rear surface by an etching technique or the like. Subsequently, conductive coating such as an electroless silver plating is deposited on opposite cut side portions of the double-sided printed substrate to form side connecting conductors 48a and 48b so that the circuit pattern 47a and the cathode 46a are electrically connected through the side connecting conductor 48a and the circuit pattern 47b and the anode 46b are electrically connected through the side connecting conductor 48b.

Thereafter, the light-emitting element 41 having two terminals is mounted on the circuit pattern 47a on the resinous substrate 42 by bonding electrically one of the terminals to the circuit pattern 47a with an electroconductive bonding material 44, and the other terminal is electrically connected to the circuit pattern 47b through a gold wire 45. The resultant assembly is then enclosed with the transparent resin-molded enclosure 43 that is mounted on the front surface of the resinous substrate 42 with the light-emitting element 41 held inside the molded transparent enclosure 43, thereby completing the surface-mountable light-emitting diode device.

However, the above light-emitting diode device utilizing the resinous substrate has the difficulty in dissipating heat generated by the light-emitting element 41 since the metallic electroconductive foil deposited on the resinous substrate 42 to form the circuit patterns 47a and 47b is thin. For this reason, this conventional light-emitting diode device has some problems from a practical perspective in securing a high output capability, an operability at a large current and a high reliability. Also, there is another problem in that since light from the light-emitting element 41 tends to spread in all directions, the rays of light emitted therefrom cannot be utilized efficiently.

On the other hand, the reflection type light-emitting diode device that is manufactured using a lead frame instead of the resinous substrate as discussed above is also known as shown in FIG. 6. This reflection type light-emitting diode device of FIG. 6 is disclosed in, for example, the Japanese Laid-open Patent Publications No. 11-163411 and No. 07-211940.

The reflection type light-emitting diode device shown in FIG. 6 is generally manufactured in the following manner. Specifically, a light-emitting diode element 51 having a pair of terminals is electrically connected at one terminal thereof to one of leads 56a and 56b, which are stamped through a press work by the use of dies or by means of an etching technique, for example, the lead 56a by the use of an electroconductive bonding material 52 and at the other terminal thereof to the lead 56b through a gold wire 53. The assembly including the light-emitting element 51 electrically connected to the leads 56a and 56b is then mounted on a recessed casing 55 having a cavity defined therein, so that the light-emitting element 51 can be oriented downwardly into the cavity of the recessed casing 55, followed by filling of a transparent resinous material 54 into the cavity of the recessed casing 55, with the light-emitting element 51 consequently embedded in the transparent resinous material 54. The recessed casing 55 has a concave interior surface 57 defining the cavity thereof, which is formed as a reflecting surface. The leads 56a and 56b, situated outside the recessed casing 55, are bent downwardly to complete the light-emitting diode device shown in FIG. 7.

In this type of the light-emitting diode device, rays of light emitted from the light-emitting element 51 are, once reflected from the concave reflecting surface 57, radiated to the outside and, therefore, each of the leads 56a and 56b must have a width as small as possible not to obstruct the rays of light traveling from the light-emitting element 51 to the outside of the recessed casing 55. For this reason, in order to achieve high reflection efficiency, each of the leads 56a and 56b must have a width as small as possible as discussed above and the use of the leads 56a and 56b of a small width, however, makes it difficult to dissipate heat, evolved by the light-emitting element 51, to the outside through the leads sufficiently. As a consequence, the thermal resistance of the leads is increased, accompanied by increase of the temperature of the light-emitting element 51, which results in decrease of the lifetime of the light-emitting diode device. In addition, the temperature characteristic of the light-emitting diode device is worsened to such an extent as to decrease the output with passage of time.

DISCLOSURE OF THE INVENTION

In view of the foregoing, the present invention is intended to provide a surface-mountable, reflection type light-emitting diode device, in which heat evolved by a light-emitting diode can be efficiently and positively dissipated without the optical characteristic thereof being adversely affected and which is therefore high in reliability and excellent in temperature characteristic.

In order to accomplish the foregoing object, the present invention provides a reflection type light-emitting diode device having a reflecting surface that reflects light emitted from a light-emitting element to emit the light to the outside, which includes a recessed casing having a peripheral wall and also having a cavity defined by a concave interior reflecting surface. The recessed casing furthermore has a pair of bearing grooves defined in the peripheral wall thereof. The light-emitting diode device also includes a light-emitting element and first and second lead members each made up of a small width lead segment having a relatively small width and a large width lead segment having a relatively large width, with the light-emitting element mounted on the small width lead segment of one of the first and second lead members. The first and second lead members are carried by the recessed casing with the small width lead segments thereof received within the respective bearing grooves of the peripheral wall of the recessed casing.

According to the present invention, heat evolved by the light-emitting element during the operation of the reflection type light-emitting diode device can be dissipated to the outside through the large width lead segments of the first and second lead members and, therefore, the thermal resistance of the light-emitting diode device can advantageously be reduced, resulting in increase of the reliability of the reflection type light-emitting diode device and enabling the reflection type light-emitting diode device to provide a high output.

In a preferred embodiment of the present invention, the small width lead segments of the first and second lead members may be bent outside the bearing grooves of the peripheral wall of the recessed casing to allow the large width lead segments to extend along an outer surface of the peripheral wall of the recessed casing, respectively. Bending of the small width lead segments outside the recessed casing makes it easy to accomplish the bending process with minimization of the bending stress and, therefore, the possibility of damage to the light-emitting element by bending can advantageously be minimized without the reliability being reduced.

In another preferred embodiment of the present invention, the large width lead segments extending along the outer surface of the peripheral wall of the recessed casing are inwardly bend at respective free end portions thereof adjacent a bottom wall of the recessed casing so as to confront with each other to thereby define corresponding surface-mountable terminals. When the light-emitting diode device is surface-mounted on a printed circuit board, the end portions of the large width lead segments are utilized as respective terminals that are soldered to different portions of a circuit pattern printed on the printed circuit board. Accordingly, the precision with which the light-emitting diode device is surface-mounted on the printed circuit board can advantageously be increased and, therefore, any undesirable tilt or inclination of the light-emitting diode device relative to the printed circuit board can be minimized or substantially eliminated.

BRIEF DESCRIPTION OF THE DRAWINGS

FIG. 1 is a perspective view, showing first and second lead members and a light-emitting element mounted on one of the first and second lead members in accordance with the present invention;

FIG. 2A is a perspective view of a recessed casing for accommodating the first and second lead members and the light-emitting element carried by one of the first and second leas members in accordance with the present invention;

FIG. 2B is a side view of the recessed casing, showing a concave reflecting surface and grooves both defined in the recessed casing in accordance with the present invention;

BEST MODE FOR CARRYING OUT THE INVENTION

Figure 3:
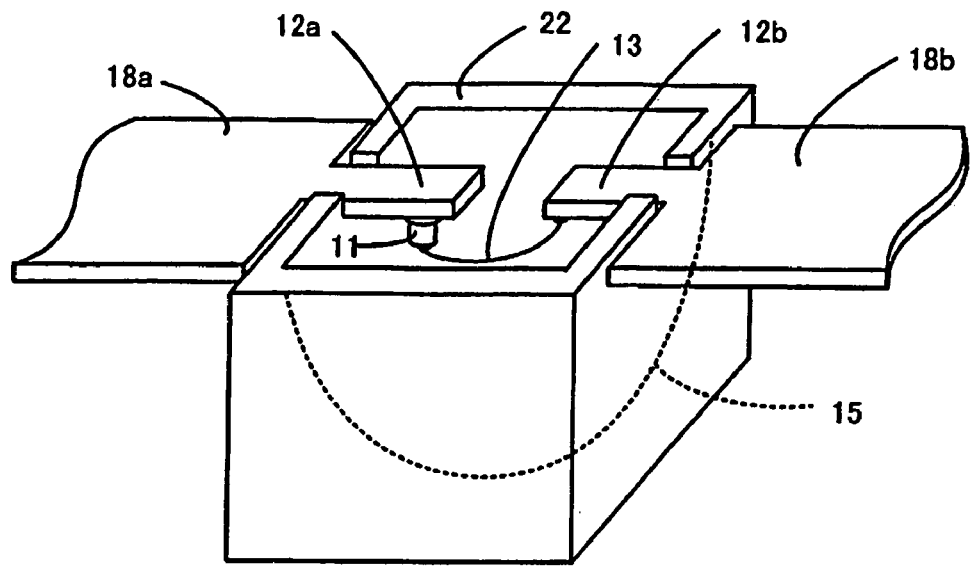
FIG. 3 is a perspective view, showing the first and second lead members carried by the recessed casing, with the light-emitting element mounted on one of the first and second lead members, in accordance with the present invention.

The details of a reflection type light-emitting diode device according to a preferred embodiment of the present invention will now be described with reference to FIGS. 1 to 4. Referring to FIG. 1, the reflection type light-emitting diode device includes first and second lead members each made up of a large width lead segment 18a or 18b and a small width lead segment 12a or 12b. While each of the first and second lead members is of one-piece construction having the large and small width lead segments 18a and 12a or 18b and 12b, the large width lead segment 18a or 18b of each lead member has a width greater than that of the small width lead segment 12a or 12b. The light-emitting diode device also includes a light-emitting element 11, for example, a light-emitting diode, having a pair of terminals. One of the terminals of the light-emitting element 11 is fixedly mounted on a mounting land defined in one of the small width lead segments, for example, the small width lead segment 12a by the use of an electro-conductive resinous material 14, whereas the other of the terminals of the light-emitting element 11 is electrically connected to the other of the small width lead segments, that is, the small width lead segment 12b through a gold wire 13.

FIGS. 2A and 2B illustrate, in a perspective view and a side view, a recessed casing 22 that is used to fix the first and second lead members. The recessed casing 22 has, for example, a box-like configuration having a peripheral wall and a bottom wall and also has a concave interior surface 15 defined therein. The concave interior surface 15 is vapor deposited or plated with an aluminum or silver to form a concave reflecting surface 15. Bearing grooves 17a and 17b for supporting the first and second lead members in a manner as will be described subsequently are formed in opposite top edge portions of the peripheral wall of the recessed casing 22.

The assembly including the first and second lead members and the light-emitting element 11 carried by the first lead member as shown in FIG. 1 is mounted on the recessed casing 22, with the light-emitting element 11 so oriented downwards as to confront the concave reflecting surface 15, as shown in FIG. 3. More specifically, respective portions of the small width lead segments 12a and 12b adjacent the corresponding large width lead segments 18a and 18b are received within the associated bearing grooves 17a and 17b. At this time, the small width lead segments 12a and 12b then received within the associated bearing grooves 17a and 17b protrudes inwardly of the recessed casing 22 in respective directions close towards each other and terminate spaced a distance from each other substantially in a plane of the opening of the recessed casing 22. On the other hand, the large width lead segments 18a and 18b protrude outwardly of the recessed casing 22 in opposite directions.

Starting from the condition as shown in FIG. 3, a transparent epoxy resin of a high viscosity containing curing catalyst is filled to a level flush with the opening of the recessed casing 22, i.e., a top face of the peripheral wall of the recessed casing 22 and, subsequently, the transparent epoxy resin is cured under an atmosphere of a temperature within the range of 80 to 105° C. Once the transparent epoxy resin has been cured, not only is the light-emitting element 11 embedded in the transparent epoxy resin, but also the first and second lead members are retained in position with the small width lead segments 12a and 12b firmly received within the respective bearing grooves 17a and 17b, thus completing integration of the recessed casing 22 with the assembly of the light-emitting element 11 and the first and second lead members.

Figure 4:
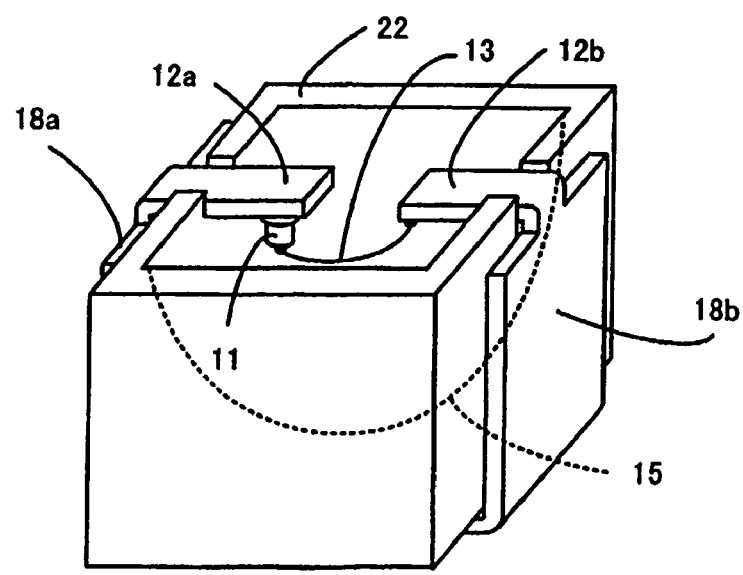
FIG. 4 is a perspective view of the light-emitting diode device of the present invention in a complete form.
Figure 5:
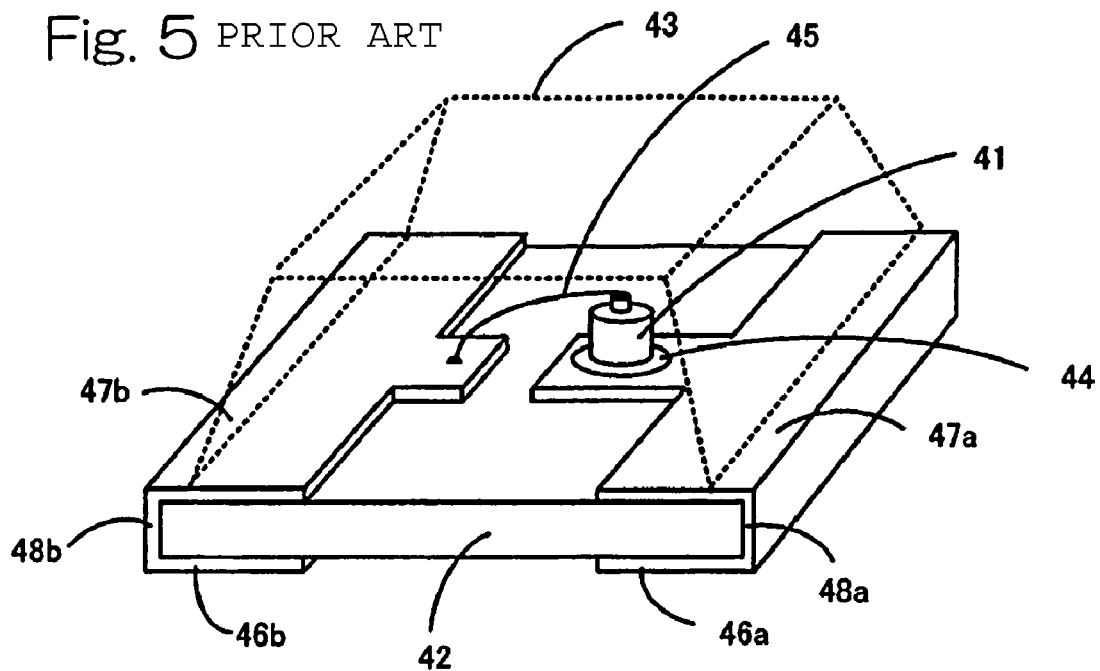
FIG. 5 is a perspective view of the conventional surface-mountable light-emitting diode device utilizing a substrate.
Figure 6:
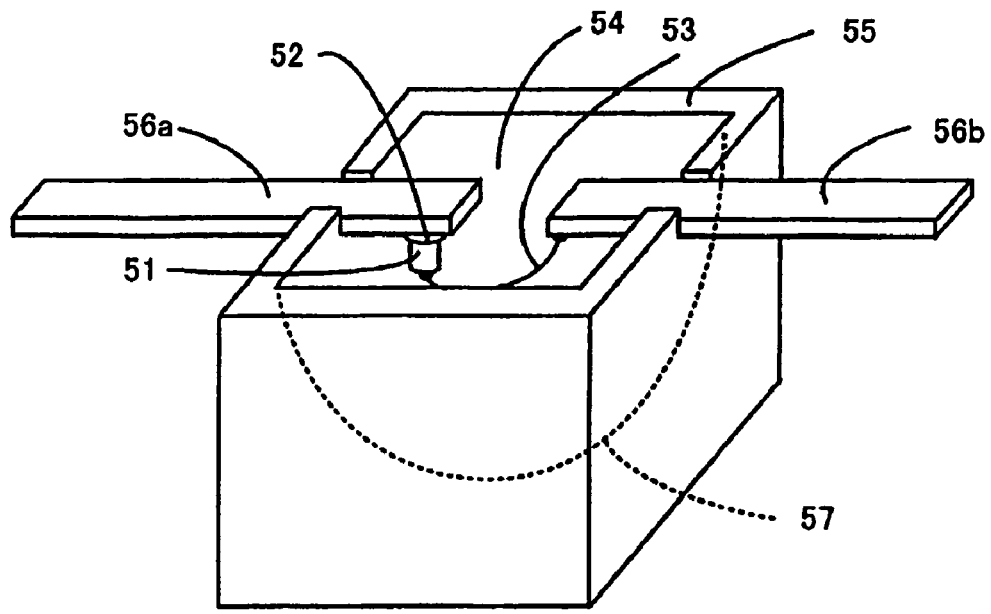
FIG. 6 is a perspective view, showing the conventional first and second lead members carried by the recessed casing, with the light-emitting element mounted on one of the first and second lead members.
Figure 7:
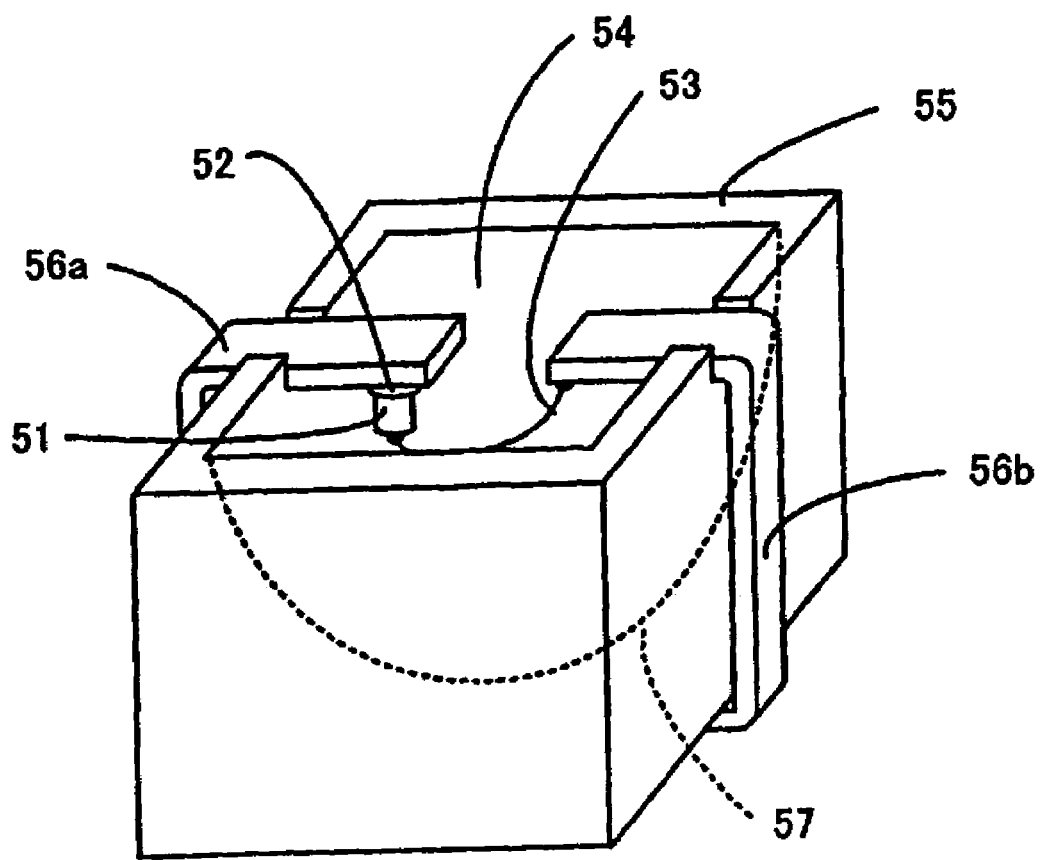
FIG. 7 is a perspective view of the conventional light-emitting diode device in a complete form.

Thereafter, the small width lead segments 12a and 12b integrated with the recessed casing 22 are bent outside the bearing grooves 17a and 17b to allow the large width lead segments 18a and 18b to extend downwardly along an outer surface of the peripheral wall of the recessed casing 22, and the large width lead segments 18a and 18b are subsequently bent to allow respective free end portions of those large width lead segments 18a and 18b to extend inwardly along an outer surface of the bottom wall of the recessed casing 22, thereby completing the light-emitting diode device as shown in FIG. 4. In this complete form of the light-emitting diode device shown in FIG. 4, the respective free end portions of the large width lead segments 18a and 18b are situated on the outer surface of the bottom wall of the recessed casing 22 in spaced relation to each other and serve as corresponding surface-mountable terminals.

From the foregoing full description of the present invention, it is clear that in the reflection type light-emitting diode device of the present invention, since the lead segments 12a and 12b positioned inside the recessed casing 22, which would otherwise interfere with the path of travel of light from the light-emitting element to the outside of the recessed casing, have a width as small as possible while the lead segments 18a and 18b have a width larger than that of the lead segments 12a and 12b outside the recessed casing 22, not only can the thermal resistance be lowered advantageously, but the precision with which the light-emitting diode device is surface-mounted on the printed circuit board can also be increased advantageously. This is quite in contrast to the conventional reflection type light-emitting diode device, in which the leads have so small a width over the entire length thereof that the thermal resistance is high enough to make it difficult for the light-emitting diode device to provide a high output.

Also, since the small width lead segments 12a and 12b are bent outside the recessed casing 22, the bending process can easily be accomplished with minimization of the bending stress, thus eliminating the possibility of the recessed casing 22 being broken.

What is claimed is:

1. A reflection type light-emitting diode device having a reflecting surface that reflects light emitted from a light-emitting element to emit the light to the outside, which device comprises:

a recessed casing having a peripheral wall and also having a cavity defined by a concave interior reflecting surface, the recessed casing furthermore having a pair of bearing grooves defined in the peripheral wall thereof;

first and second lead members each made up of a small width lead segment having a relatively small width and a large width lead segment having a relatively large width, the first and second lead members being carried by the recessed casing with the small width lead segments thereof received within the respective bearing grooves of the peripheral wall of the recessed casing; and a light-emitting element mounted on the small width lead segment of one of the first and second lead members;

wherein the small width lead segments of the first and second lead members are bent at respective portions adjacent to the large width lead segments outside the bearing grooves of the peripheral wall of the recessed casing to allow the large width lead segments to extend along an outer surface of the peripheral wall of the recessed casing, respectively.

2. The reflection type light-emitting diode device as claimed in claim 1, wherein the large width lead segments extending along the outer surface of the peripheral wall of the recessed casing are inwardly bend at respective free end portions thereof adjacent a bottom wall of the recessed casing so as to confront with each other to thereby define corresponding surface-mountable terminals.

* * * * *